US012713868B2

(12) United States Patent
Chang

(10) Patent No.: US 12,713,868 B2
(45) Date of Patent: Aug. 18, 2026

(54) PICK-AND-PLACE TOOL AND METHOD OF MANUFACTURING SEMICONDUCTOR STRUCTURE

(71) Applicant: TAIWAN SEMICONDUCTOR MANUFACTURING COMPANY LTD., Hsinchu (TW)

(72) Inventor: Jen-Yuan Chang, Hsinchu City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 1070 days.

(21) Appl. No.: 17/812,689

(22) Filed: Jul. 14, 2022

(65) Prior Publication Data

US 2024/0021448 A1 Jan. 18, 2024

(51) Int. Cl.

| | |
|---|---|
| ***H10P 72/00*** | (2026.01) |
| ***B65G 47/91*** | (2006.01) |
| *H10W 72/00* | (2026.01) |
| *H10W 80/00* | (2026.01) |
| *H10W 90/00* | (2026.01) |

(52) U.S. Cl.
CPC .......... *H10P 72/0446* (2026.01); *B65G 47/91* (2013.01); *H10W 72/07331* (2026.01); *H10W 80/312* (2026.01); *H10W 80/327* (2026.01); *H10W 90/734* (2026.01); *H10W 90/792* (2026.01)

(58) Field of Classification Search
CPC ............... H10P 72/0446; B65G 47/91; H10W 72/07331; H10W 72/78; H10W 80/312; H10W 80/327; H10W 90/734; H10W 90/792
See application file for complete search history.

(56) References Cited

U.S. PATENT DOCUMENTS

RE36,890 E * 10/2000 Wells .................. B32B 37/0007 438/455
7,958,628 B2 * 6/2011 Lee ..................... H01L 21/6838 438/455
2020/0027855 A1 * 1/2020 Lee ....................... H01L 21/563

FOREIGN PATENT DOCUMENTS

EP 1321966 A1 * 6/2003 ....... H01L 21/67132
JP 2007194314 A * 8/2007
KR 20080007716 A * 1/2008 ....... H01L 21/67259

* cited by examiner

*Primary Examiner* — Stephen A Vu
(74) *Attorney, Agent, or Firm* — WPAT LAW; Anthony King

(57) ABSTRACT

A pick-and-place tool includes a bond base and an attaching head. The attaching head is connected to the bond base and configured to attract a chip by a suction force. The attaching head has an attaching surface that is convex toward the chip, the attaching head has a plurality of suction holes penetrating the attaching surface, and the attaching head attracts the chip using the suction force via the suction holes.

20 Claims, 19 Drawing Sheets

PICK-AND-PLACE TOOL AND METHOD OF MANUFACTURING SEMICONDUCTOR STRUCTURE

BACKGROUND

The manufacturing of integrated circuits often involves bonding dies to wafers or package substrates. In a typical bonding process, a bond head picks up a die and then places the die on a wafer or a package substrate. After one or more dies are placed on a wafer or a package substrate, a reflow process is performed, so that the dies are bonded to the wafer or the package substrate to form a package. The placement of the dies on the wafer or the package substrate needs to be well controlled to maintain the yield of the bonding process.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 3A to 3H are top views of arrangements of suction holes of an attaching head and/or through holes of a buffer element in accordance with some embodiments of the present disclosure.

DETAILED DESCRIPTION

Figure 1A:
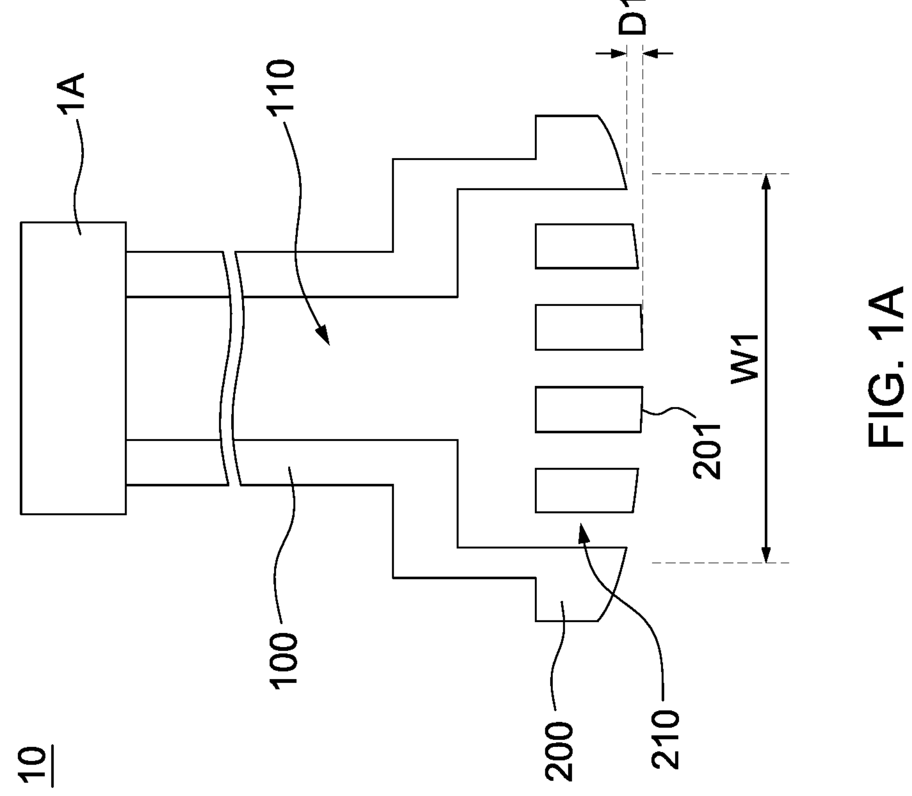
FIG. 1A is a cross-sectional view of a pick-and-place tool in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper,” “on” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as “first,” “second” and “third” describe various elements, components, regions, layers and/or sections, but these elements, components, regions, layers and/or sections should not be limited by these terms. These terms may be only used to distinguish one element, component, region, layer or section from another. The terms such as “first,” “second” and “third” when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms “substantially.” “approximately” or “about” generally mean within a value or range that can be contemplated by people having ordinary skill in the art. Alternatively, the terms “substantially,” “approximately” or “about” mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms “substantially,” “approximately” or “about.” Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Embodiments of the present disclosure discuss a pick-and-place tool for bonding processes. The pick-and-place tool includes an attaching head having a convex attaching surface. With the aforesaid design, the chip that is picked up by the pick-and-place tool may deform according to the convex surface to form a protruded center portion or a convex surface facing a package substrate to be bonded. Therefore, the center portion of the chip can contact and bond to the package substrate before the edge or peripheral region of the chip contacting the package substrate, and thus formation of a gap or an air gap at the interface between the chip and the package substrate can be prevented.

FIG. 1A is a cross-sectional view of a pick-and-place tool 10 in accordance with some embodiments of the present disclosure.

Referring to FIG. 1A, the pick-and-place tool 10 includes a bond base 100 and an attaching head 200. The bond base 100 and the attaching head 200 may be collectively referred to as a bond head of the pick-and-place tool 10.

The bond base 100 may include a channel 110 (also referred to as “a pipeline”) connected to a pressure source, e.g., a vacuum pump 1A. The vacuum pump 1A may be external to the bond base 100. The vacuum pump 1A may be configured to generate a suction force for the attaching head 200. The vacuum pump 1A may be configured to generate or create a vacuum or a relatively low pressure condition inside the bond base 100 and the attaching head 200 compared to an ambient pressure outside of the bond base 100 and the attaching head 200. In some embodiments, the bond base 100 includes or is made of metal. The metal may be stainless steel, aluminum, or the like.

The attaching head 200 may be connected to the bond base 100. In some embodiments, the attaching head 200 is configured to attract a chip by a suction force. The suction force may be generated by the vacuum pump 1A. In some embodiments, the attaching head 200 includes or is made of metal. The metal may be stainless steel, aluminum, or the like. In some embodiments, the bond base 100 and the attaching head 200 are integrally formed.

In some embodiments, the attaching head 200 has a convex surface 201 (also referred to as “an attaching surface”) that is convex toward a chip. In some embodiments, the attaching head 200 has a plurality of suction holes 210 penetrating the convex surface 201. In some embodiments, the attaching head 200 attracts a chip using the suction force via the suction holes 210. In some embodiments, the suction holes 210 may be channels or through holes that penetrate a portion of the attaching head 200. In some embodiments, the suction holes 210 are connected to the channel 110 of the bond base 100.

In some embodiments, the convex surface 201 has a width W1 corresponding to a width of a chip which is to be picked up by the pick-and-place tool 10. In some embodiments, the width W1 is a width of a contact area between the convex surface 201 and a chip which is to be picked up by the pick-and-place tool 10. The convex surface 201 may have a center portion which is convex or protruded toward the chip and an edge portion which is recessed from the center portion, and an elevation of the center portion is distanced from an elevation of the edge portion by a distance D1. In some embodiments, the distance D1 is less than about 80% the width W1 of the chip. In some embodiments, the distance D1 is less than about 50%, about 20%, about 10%, about 5%, about 1%, or about 0.1% the width W1 of the chip. In some embodiments, the distance D1 is equal to or less than about 0.01% the width W1 of the chip. In some embodiments, the distance D1 is equal to or greater than about 1 μm, about 5 μm, about 10 μm, about 15 μm, or about 20 μm.

In some embodiments, the vacuum pump 1A is configured to generate or create a vacuum or a relatively low pressure condition inside the channel 110 of the bond base 100 and the suction holes 210 of the attaching head 200 compared to an ambient pressure outside of the bond base 100 and the attaching head 200. In some embodiments, the pressure within the channel 110 and the suction holes 210 is substantially uniform and lower than an ambient pressure outside of the bond base 100 and the attaching head 200. In some embodiments, a pressure P1 within the channel 110 and the suction holes 210 may be less than about 99.9% an ambient pressure P2 outside of the bond base 100 and the attaching head 200. In some embodiments, the pressure P1 within the channel 110 and the suction holes 210 is less than about 50%, about 30%, about 20%, or about 10% the ambient pressure P2.

According to some embodiments of the present disclosure, with the design of the convex surface 201 of the attaching head 200, the chip that is picked up by the pick-and-place tool 10 may deform according to the convex surface 201 to form a protruded center portion or a convex surface facing a package substrate to be bonded. Therefore, the center portion of the chip can contact and bond to the package substrate before the edge or peripheral region of the chip contacting the package substrate, and thus formation of a gap or an air gap at the interface between the chip and the package substrate can be prevented.

In addition, according to some embodiments of the present disclosure, with the design of the suction holes 210 of the convex surface 201 of the attaching head 200, the attaching surface (i.e., the convex surface 201) of the attaching head 200 may attract a chip by supplying a relatively uniform suction force to the entire chip, for example, through the “porous” design of the suction holes 210 of the convex surface 201. Therefore, the chip can be stably attached to the attaching head 200 while being transferred for the following bonding process.

Moreover, according to some embodiments of the present disclosure, with the design of the distance D1 between an elevation of the center portion of the convex surface 201 and an elevation of the edge portion of the convex surface 201, a satisfactory deformation of the chip that is picked up by the pick-and-place tool 10 can be obtained without damaging the chip (e.g., breakage of the chip), and thus the formation of a gap or an air gap at the interface between the chip and the package substrate can be prevented without undesirably lowering the yield of the bonding process.

Figure 1B:
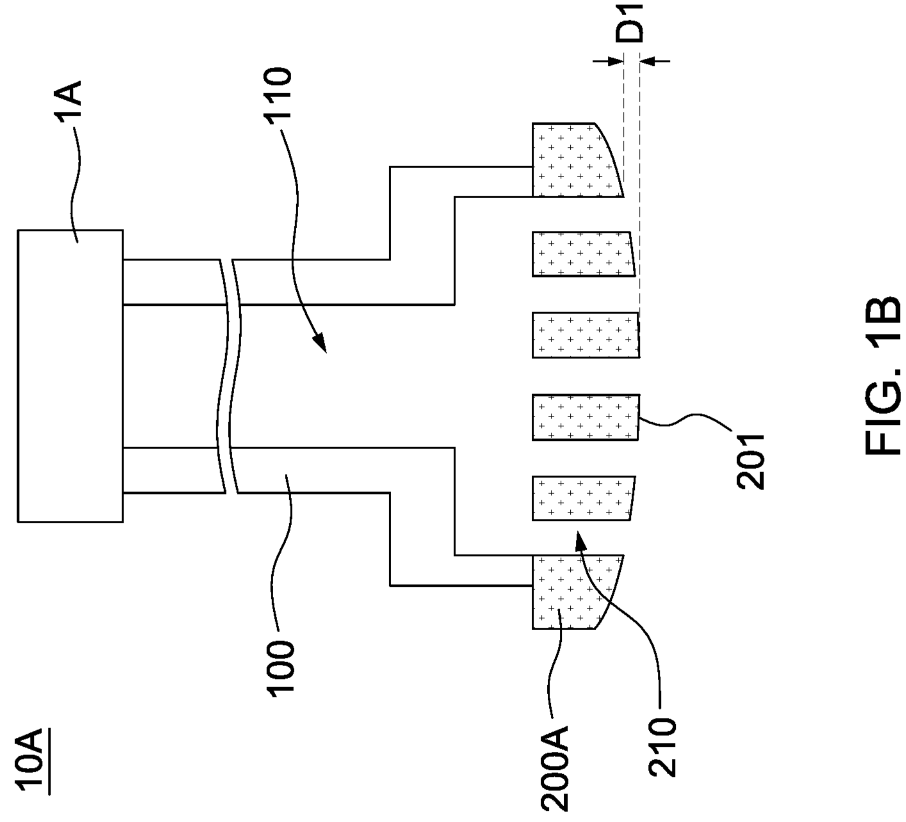
FIG. 1B is a cross-sectional view of a pick-and-place tool in accordance with some embodiments of the present disclosure.

FIG. 1B is a cross-sectional view of a pick-and-place tool 10A in accordance with some embodiments of the present disclosure. In some embodiments, the pick-and-place tool 10A is similar to the pick-and-place tool 10 in FIG. 1A, with differences therebetween as follows. Descriptions of similar components are omitted.

In some embodiments, the attaching head 200A is mounted on or attached to the bond head 100. In some embodiments, the attaching head 200A is detachably mounted on the bond head 100. In some embodiments, the bond head 100 and the attaching head 200A are made of or include different materials. In some embodiments, a hardness of the bond head 100 is greater than a hardness of the attaching head 200A. In some embodiments, the bond head 100 is made of or includes metal, and the attaching head 200A is made of or includes a flexible material. In some embodiments, the attaching head 200A is made of or includes rubber, plastic, an epoxy-based material (e.g., epoxy resin), glue, or the like.

According to some embodiments of the present disclosure, the attaching head 200A is made of or includes a flexible material, and thus the attaching head 200A can provide further buffer between the pick-and-place tool 10A and chip which is to be picked up by the pick-and-place tool 10A. Therefore, possible damages to the chip can be prevented.

In addition, according to some embodiments of the present disclosure, the attaching head 200A is detachably mounted on the bond head 100, it is advantageous to replacing various types of the attaching head 200A according to different requirements for the chip that is to be picked up, and it is also convenient for fixing the attaching head 200A when it is broken, which further reduces the cost.

Figure 1C:
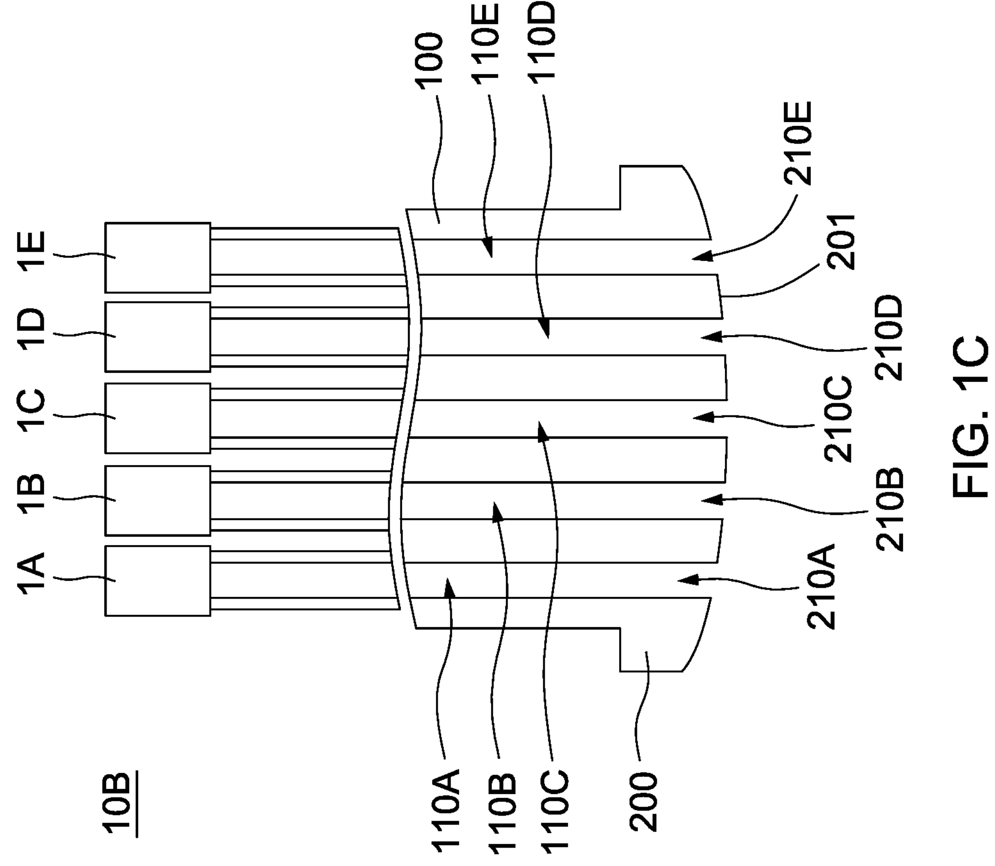
FIG. 1C is a cross-sectional view of a pick-and-place tool in accordance with some embodiments of the present disclosure.

FIG. 1C is a cross-sectional view of a pick-and-place tool 10B in accordance with some embodiments of the present disclosure. In some embodiments, the pick-and-place tool 10B is similar to the pick-and-place tool 10 in FIG. 1A, with differences therebetween as follows. Descriptions of similar components are omitted.

In some embodiments, the bond base 100 of the pick-and-place tool 10B includes a plurality of channels (e.g., channels 110A, 110B, 110C, 110D, and 110E). In some embodiments, the channels 110A, 110B, 110C, 110D, and 110E are isolated from each other. Each of the channels of the bond base 100 may connect one of the suctions holes of the attaching head 200 to a respective pressure source. In some embodiments, the channel 110A connects the suction hole 210A to the vacuum pump 1A, the channel 110B connects the suction hole 210B to the vacuum pump 1B, the channel 110C connects the suction hole 210C to the vacuum pump 1C, the channel 110D connects the suction hole 210D to the vacuum pump 1D, and the channel 110E connects the suction hole 210E to the vacuum pump 1E.

In some embodiments, at least two of the suction forces generated by the vacuum pumps 1A to 1E may be different from each other. In some embodiments, a suction force supplied through the channels 110A and 110E connected to the suction holes 210A and 210E located at an edge portion of the convex surface 201 is greater than a suction force supplied through the channels 110B, 110C, and 110D connected to the suction holes 210B, 210C, and 210D located at a center portion of the convex surface 201. In some embodiments, a suction force supplied through the channels 110B and 110D connected to the suction holes 210B and 210D is greater than a suction force supplied through the channel 110C connected to the suction hole 210C. In some embodiments, at least two of the vacuum pumps 1A to 1E are configured to generate or create different vacuum or relatively low pressure conditions inside the bond base 100 and the attaching head 200.

In some embodiments, the bond base 100 and the attaching head 200 are integrally formed, and each of the channels of the bond base 100 is directly connect to a corresponding suction hole of the attaching head 200. In some other embodiments, referring to FIG. 1B, the attaching head 200 may be made of or include a flexible material and detachably mounted on the bond head 100, and each of the channels of the bond base 100 is detachably connected to a corresponding suction hole of the attaching head 200.

According to some embodiments of the present disclosure, with the design of the multiple channels of the bond base 100, the flexibility as well as the control over the suction force can be increased. Therefore, the yield may be improved.

Figure 2A:
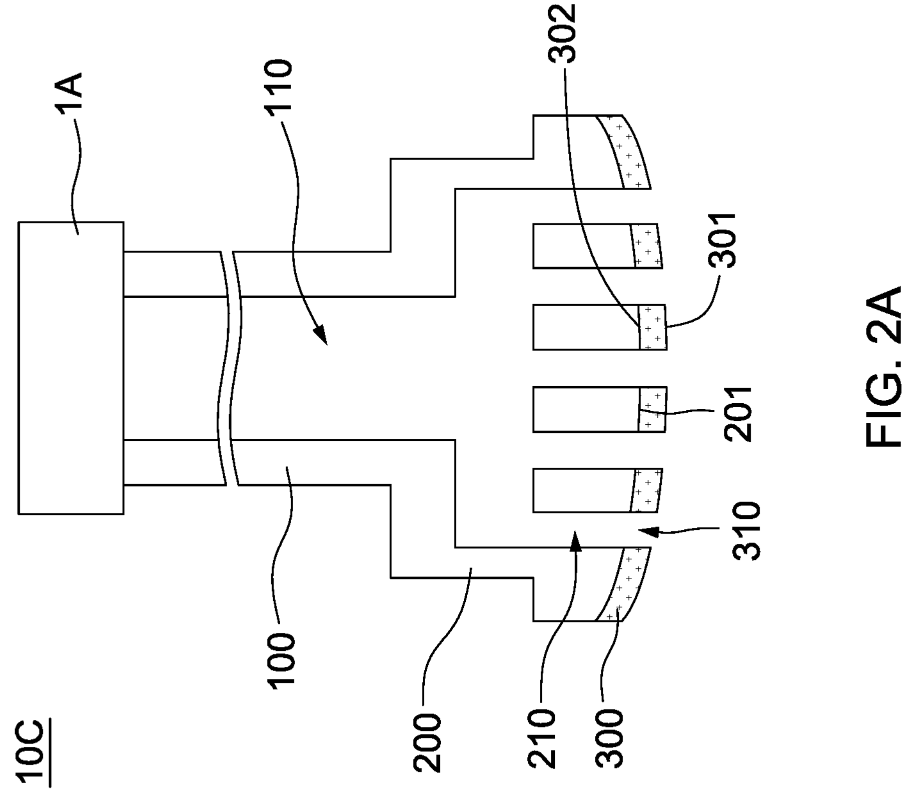
FIG. 2A is a cross-sectional view of a pick-and-place tool in accordance with some embodiments of the present disclosure.

FIG. 2A is a cross-sectional view of a pick-and-place tool 10C in accordance with some embodiments of the present disclosure. In some embodiments, the pick-and-place tool 10C is similar to the pick-and-place tool 10 in FIG. 1A, with differences therebetween as follows. Descriptions of similar components are omitted.

In some embodiments, the pick-and-place tool 10C further includes a buffer element 300. In some embodiments, the buffer element 300 is mounted on the convex surface 201 of the attaching head 200. In some embodiments, the buffer element 300 is detachably mounted on the convex surface 201 of the attaching head 200. In some embodiments, the buffer element 300 is configured to attract a chip by a suction force. The suction force may be generated by the vacuum pump 1A.

In some embodiments, a hardness of the buffer element 300 is less than a hardness of the attaching head 200. In some embodiments, the attaching head 200 includes or is made of metal. The metal may be stainless steel, aluminum, or the like. In some embodiments, the bond base 100 and the attaching head 200 are integrally formed. In some embodiments, the buffer element 300 is made of or includes a flexible material. The buffer element 300 may be referred to as a flexible element. In some embodiments, the buffer element 300 is made of or includes rubber, plastic, an epoxy-based material (e.g., epoxy resin), glue, or the like. In some embodiments, the buffer element 300 conforms to the convex surface 201 of the attaching head 200. In some embodiments, a surface 302 of the buffer element 300 directly contacts and conforms to the convex surface 201 of the attaching head 200.

In some embodiments, the buffer element 300 has a surface 301 opposite to the surface 302 and convex toward a chip. In some embodiments, the buffer element 300 includes a plurality of through holes 310 penetrating between the surface 301 and the surface 302 of the buffer element 300. In some embodiments, the buffer element 300 attracts a chip using the suction force via the through holes 310. In some embodiments, the through holes 310 are connected to the suction holes 210 of the attaching head 200. In some embodiments, each of the through holes 310 is connected to one of the suction holes 210 of the attaching head 200. In some embodiments, the buffer element 300 attracts the chip using the suction force via the suction holes 210 and the through holes 310. In some embodiments, the buffer element 300 deforms when the chip is attached onto the buffer element 300 by the suction force.

In some embodiments, referring to FIG. 1C, the bond base 100 may include a plurality of channels each connecting one of the through holes 310 to a respective pressure source.

According to some embodiments of the present disclosure, the buffer element 300 is made of or includes a flexible material, and thus the buffer element 300 can provide further buffer between the pick-and-place tool 10C and chip which is to be picked up by the pick-and-place tool 10C. Therefore, possible damages to the chip can be prevented.

In addition, according to some embodiments of the present disclosure, the buffer element 300 is detachably mounted on the attaching head 200, it is advantageous to replacing various types of the buffer element 300 according to different requirements for the chip that is to be picked up, and it is also convenient for fixing the buffer element 300 when it is broken, which further reduces the cost.

Figure 2B:
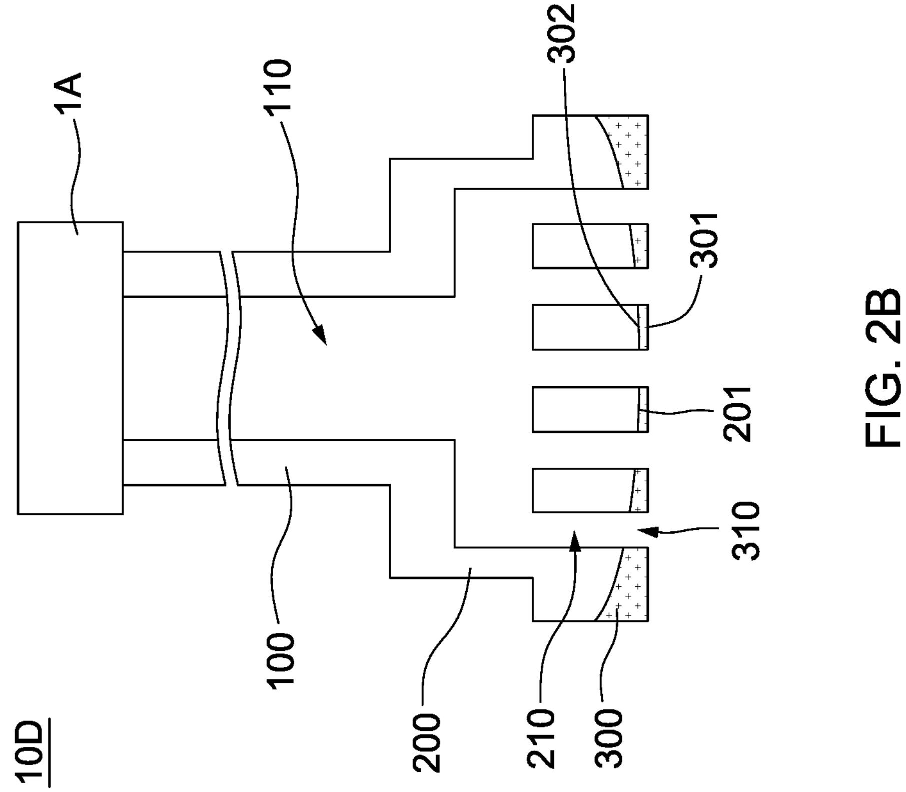
FIG. 2B is a cross-sectional view of a pick-and-place tool in accordance with some embodiments of the present disclosure.

FIG. 2B is a cross-sectional view of a pick-and-place tool 10D in accordance with some embodiments of the present disclosure. In some embodiments, the pick-and-place tool 10D is similar to the pick-and-place tool 10C in FIG. 2A, with differences therebetween as follows. Descriptions of similar components are omitted.

In some embodiments, the surface 301 of the buffer element 300 is substantially plat or planar. In some embodiments, a thickness of the buffer element 300 increases from a center portion towards an edge portion. In some embodiments, a depth (or a length) of the through hole 310 located at an edge portion of the buffer element 300 is greater than a depth (or a length) of the through hole 310 located at a center portion of the buffer element 300.

Figure 2C:
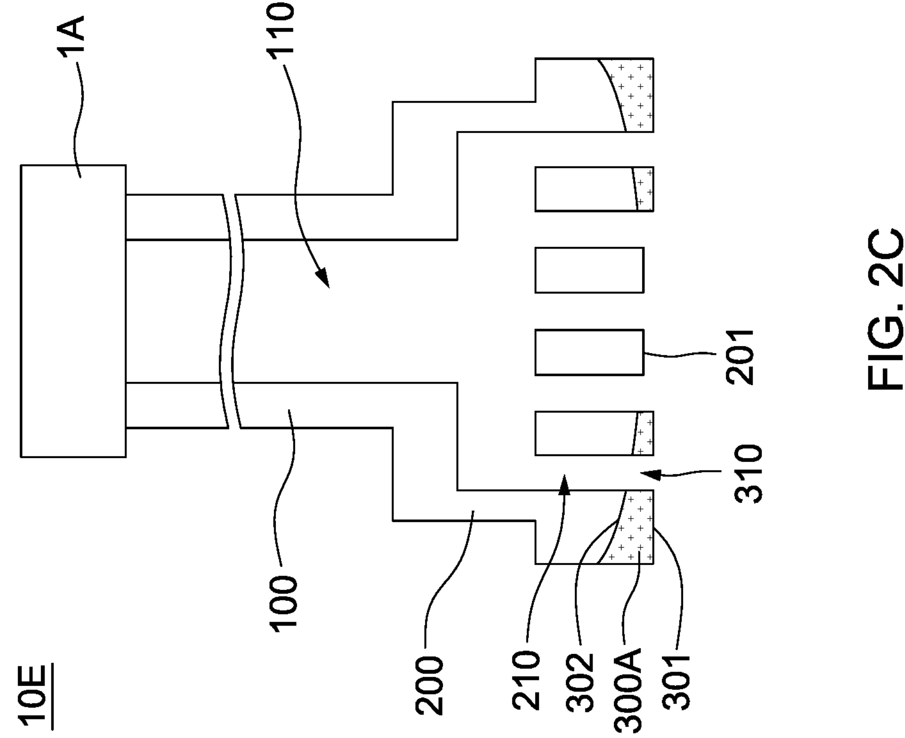
FIG. 2C is a cross-sectional view of a pick-and-place tool in accordance with some embodiments of the present disclosure.

FIG. 2C is a cross-sectional view of a pick-and-place tool 10E in accordance with some embodiments of the present disclosure. In some embodiments, the pick-and-place tool 10E is similar to the pick-and-place tool 10C in FIG. 2A, with differences therebetween as follows. Descriptions of similar components are omitted.

In some embodiments, a portion of the convex surface 201 of the attaching head 200 is exposed by the buffer element 300. In some embodiments, a center portion of the convex surface 201 of the attaching head 200 is exposed by the buffer element 300. In some embodiments, an edge portion of the convex surface 201 of the attaching head 200 is covered by the buffer element 300. In some embodiments, the surface 301 of the buffer element 300 is substantially plat or planar. In some embodiments, a portion of the buffer element 300 adjacent to a center portion of the convex surface 201 of the attaching head 200 has a thickness less than a thickness of a portion of the buffer element 300 proximal to the center portion of the convex surface 201 of the attaching head 200.

Figure 2D:
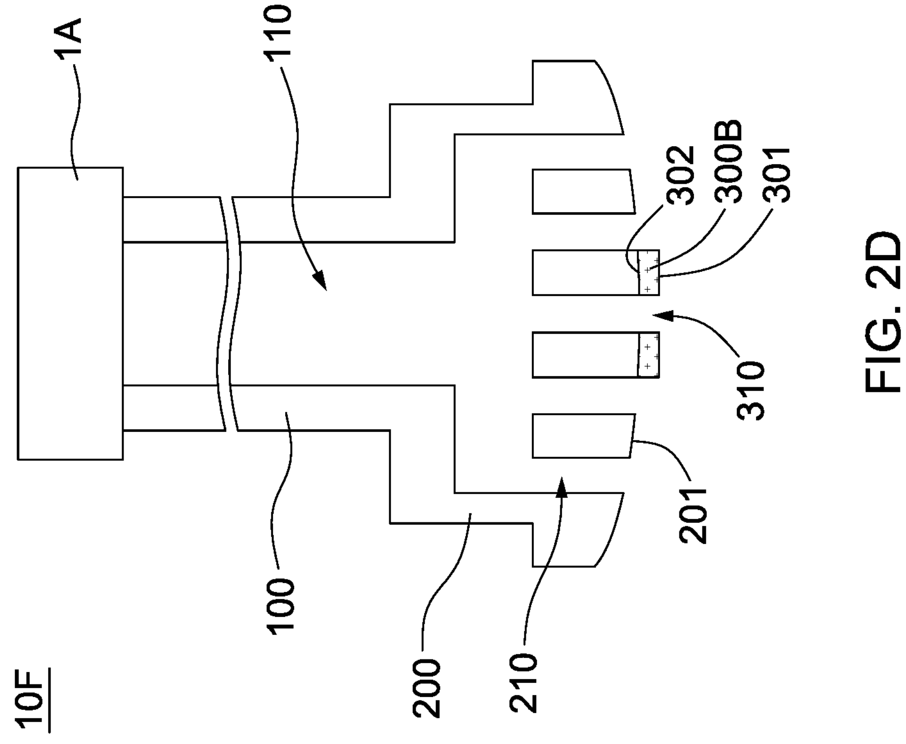
FIG. 2D is a cross-sectional view of a pick-and-place tool in accordance with some embodiments of the present disclosure.

FIG. 2D is a cross-sectional view of a pick-and-place tool 10F in accordance with some embodiments of the present disclosure. In some embodiments, the pick-and-place tool 10F is similar to the pick-and-place tool 10C in FIG. 2A, with differences therebetween as follows. Descriptions of similar components are omitted.

In some embodiments, a portion of the convex surface 201 of the attaching head 200 is exposed by the buffer element 300. In some embodiments, an edge portion of the convex surface 201 of the attaching head 200 is exposed by the buffer element 300. In some embodiments, a center portion of the convex surface 201 of the attaching head 200 is covered by the buffer element 300. In some embodiments, the surface 301 of the buffer element 300 is substantially plat or planar.

FIGS. 3A to 3H are top views of arrangements of suction holes of an attaching head and/or through holes of a buffer element in accordance with some embodiments of the present disclosure.

Figures 3A, 3B, 3C, 3D:
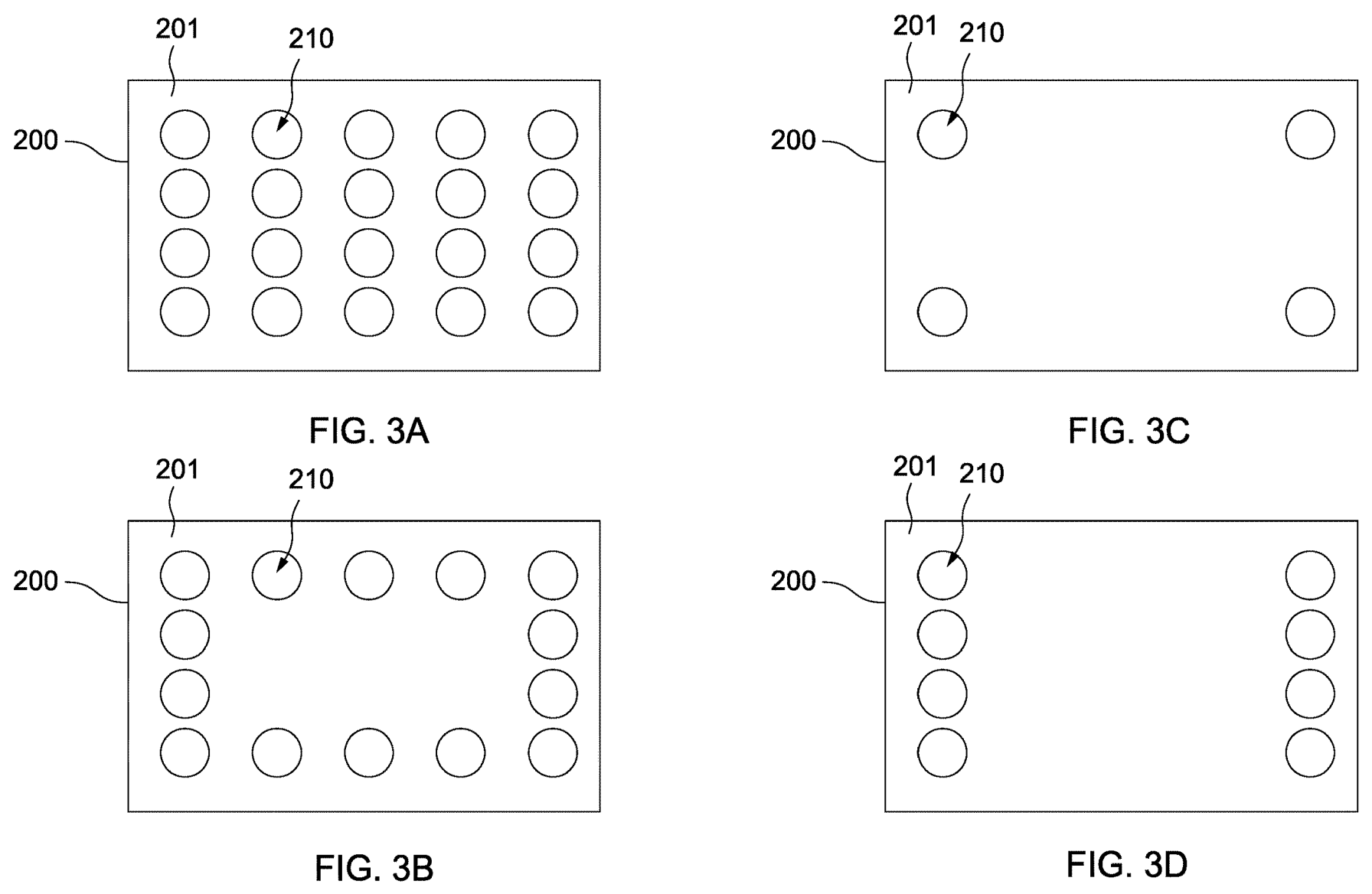

Referring to FIG. 3A, in some embodiments, the suction holes 210 are located at substantially all over the convex surface 201 of the attaching head 200. In some embodiments, the suction holes 210 have substantially the same size and the same shape. In some embodiments, the buffer member 300 is further mounted on the convex surface 201 of the attaching head 200, and the through holes 310 may have an arrangement similar to that of the suction holes 210 shown in FIG. 3A.

Referring to FIG. 3B, in some embodiments, the suction holes 210 are located at an edge portion of the convex surface 201 of the attaching head 200. In some embodiments, the suction holes 210 are located at a peripheral portion that surrounds a center portion of the convex surface 201 of the attaching head 200. In some embodiments, the suction holes 210 have substantially the same size and the same shape. In some embodiments, the buffer member 300 is further mounted on the convex surface 201 of the attaching head 200, and the through holes 310 may have an arrangement similar to that of the suction holes 210 shown in FIG. 3B.

Referring to FIG. 3C, in some embodiments, the suction holes 210 are located at corners of the convex surface 201 of the attaching head 200. In some embodiments, the suction holes 210 have substantially the same size and the same shape. In some embodiments, the buffer member 300 is further mounted on the convex surface 201 of the attaching head 200, and the through holes 310 may have an arrangement similar to that of the suction holes 210 shown in FIG. 3C.

Referring to FIG. 3D, in some embodiments, the suction holes 210 are located adjacent to opposite edges of the convex surface 201 of the attaching head 200. In some embodiments, the suction holes 210 are arranged in two rows along two edges of the convex surface 201 of the attaching head 200. In some embodiments, the suction holes 210 have substantially the same size and the same shape. In some embodiments, the buffer member 300 is further mounted on the convex surface 201 of the attaching head 200, and the through holes 310 may have an arrangement similar to that of the suction holes 210 shown in FIG. 3D.

Figures 3E, 3F, 3G, 3H:
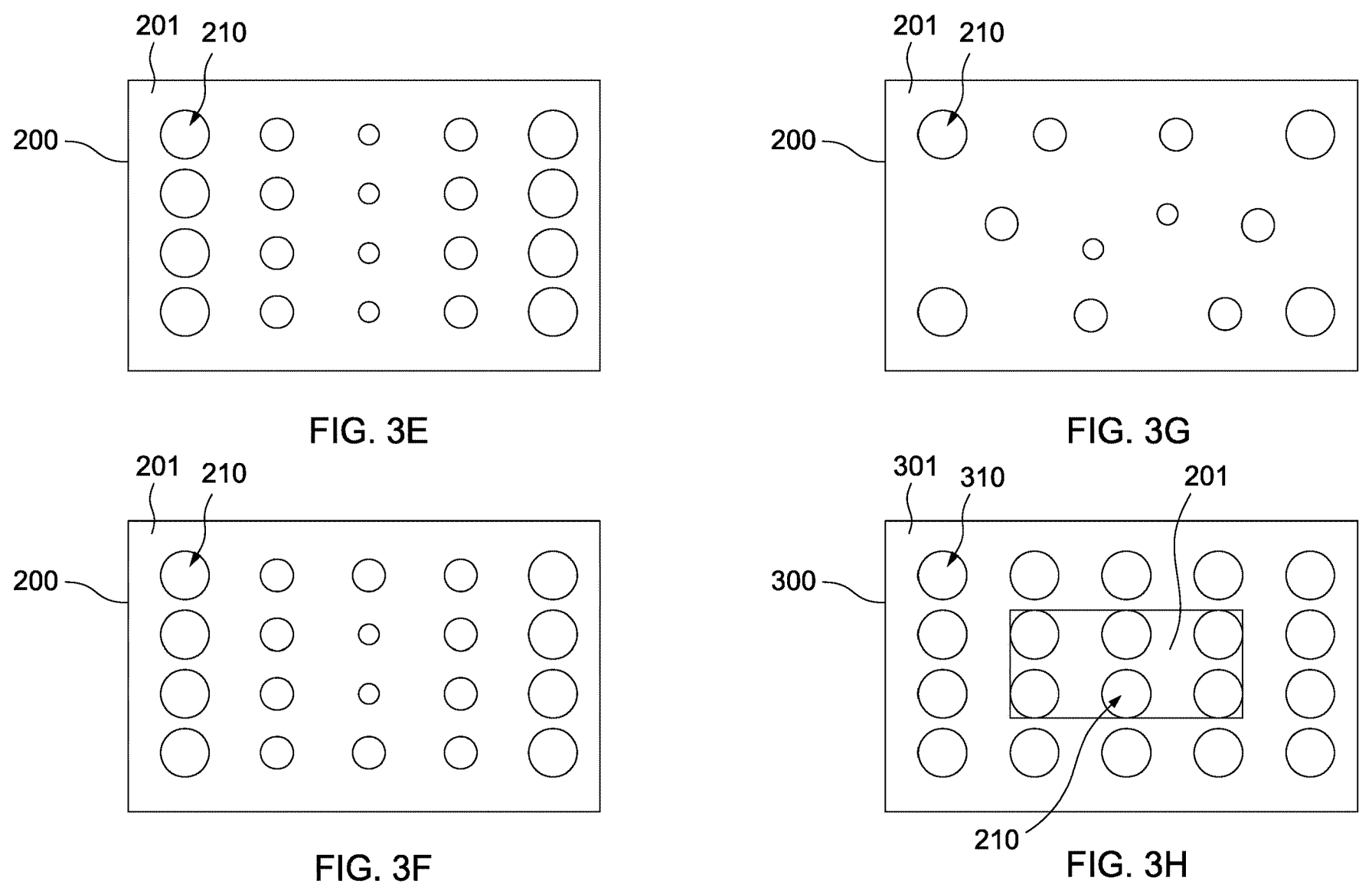

Referring to FIG. 3E, in some embodiments, the suction holes 210 may have different sizes. In some embodiments, a size of the suction holes 210 located at an edge portion of the convex surface 201 is greater than a size of the suction holes 210 located at a center portion of the convex surface 201. In some embodiments, the suction holes 210 gradually decrease in sizes from those located at a center portion of the convex surface 201 to those located adjacent two opposite edges of the convex surface 201. In some embodiments, the buffer member 300 is further mounted on the convex surface 201 of the attaching head 200, and the through holes 310 may have an arrangement similar to that of the suction holes 210 shown in FIG. 3E.

Referring to FIG. 3F, in some embodiments, the suction holes 210 may have different sizes. In some embodiments, a size of the suction holes 210 located at an edge portion of the convex surface 201 is greater than a size of the suction holes 210 located at a center portion of the convex surface 201. In some embodiments, the suction holes 210 gradually decrease in sizes from those located at a center portion of the convex surface 201 to those located at a peripheral portion of the convex surface 201. In some embodiments, the buffer member 300 is further mounted on the convex surface 201 of the attaching head 200, and the through holes 310 may have an arrangement similar to that of the suction holes 210 shown in FIG. 3F.

Referring to FIG. 3G, in some embodiments, the suction holes 210 may have different sizes. In some embodiments, the suction holes 210 may have a random arrangement in sizes all over the convex surface 201. In some embodiments, the buffer member 300 is further mounted on the convex surface 201 of the attaching head 200, and the through holes 310 may have an arrangement similar to that of the suction holes 210 shown in FIG. 3G.

Referring to FIG. 3H, in some embodiments, the buffer member 300 is further mounted on the convex surface 201 of the attaching head 200 and only covers a portion of the convex surface 201. In some embodiments, the buffer member 300 covers a peripheral portion of the convex surface 201. In some embodiments, the structure illustrated in FIG. 3H may have a cross-sectional structure as shown in FIG. 2C. In some other embodiments, the buffer member 300 may cover one or more different portions (e.g., referring to FIGS. 2C and 2D) of the convex surface 201. In some embodiments, the through holes 310 may have an arrangement similar to that of the suction holes 210 directly under the through holes 310, as shown in FIG. 3H.

FIGS. 4A to 4E are schematic views of intermediate stages of a method of manufacturing a semiconductor structure in accordance with some embodiments of the present disclosure.

Figures 4A, 4B:
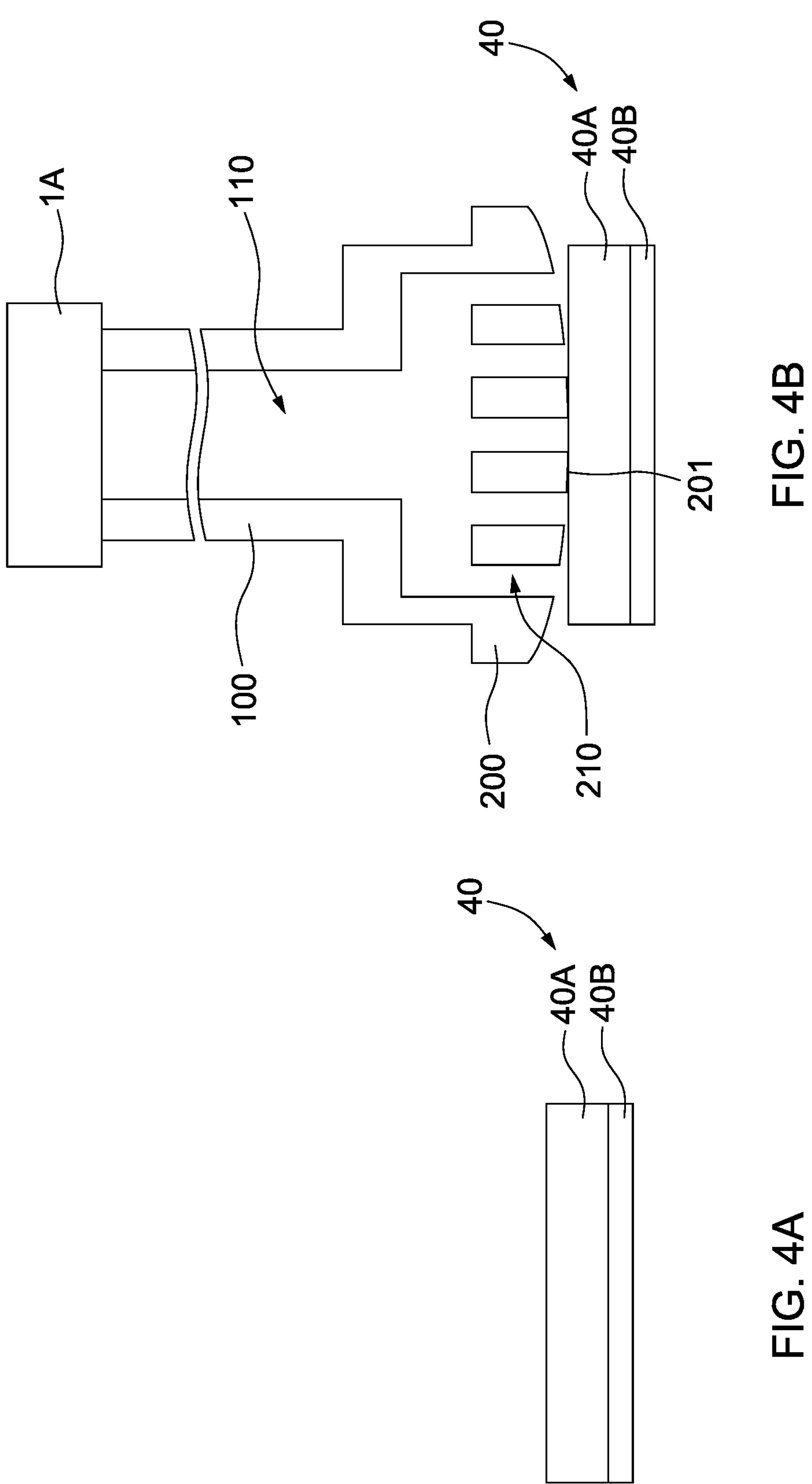
FIGS. 4A to 4E are schematic views of intermediate stages of a method of manufacturing a semiconductor structure in accordance with some embodiments of the present disclosure.

Referring to FIG. 4A, a chip 40 including a semiconductor substrate 40A and a bonding layer 40B may be provided. The bonding layer 40B may be configured to be hybrid-bonded or fusion-bonded to another bonding layer. In some embodiments, the bonding layer 40B includes a dielectric layer. The dielectric layer may be or include silicon oxide, silicon oxynitride, or the like.

Referring to FIG. 4B, a pick-and-place tool 10 including an attaching head 200 having a convex surface 201 may be provided. In some embodiments, the convex surface 201 of the attaching head 200 is brought towards the chip 40. In some embodiments, a center portion of the chip convex surface 201 is brought in contact with the chip 40.

Figure 4C:
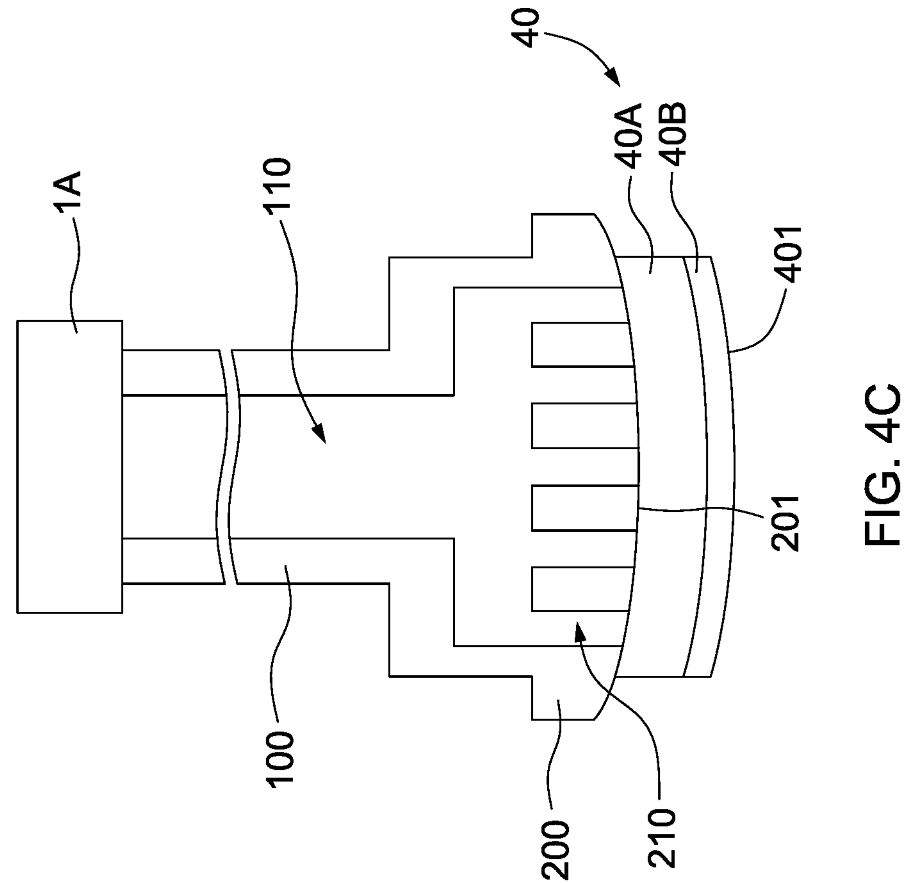

Referring to FIG. 4C, the convex surface 201 of the attaching head 200 may be brought towards the chip 40 to attract the chip 40 by a suction force. In some embodiments, the chip 40 deforms according to the convex surface 201 of the attaching head 200 when the chip 40 is attracted by the attaching head 20. In some embodiments, the chip 40 deforms to conform to the convex surface 201 of the attaching head 200 and form a convex surface 401 toward a package substrate (i.e., a direction facing away from the pick-and-place tool 10).

In some embodiments, a relatively large suction force may be applied on an edge portion of the chip 40, and a relatively small suction force may be applied on a center portion of the chip 40, so as to deform the chip 40 to form a convex surface facing a direction away from the attaching head 200.

In some other embodiments, a size of the suction holes 210 located at an edge portion of the convex surface 201 may be greater than a size of the suction holes 201 located at a center portion of the convex surface 201, and thus the suction holes 210 at the edge portion of the convex surface 201 may provide a relatively large suction force, so as to further facilitate the chip 40 to deform or shape into the shape of the convex surface 201 of the attaching head 200. In the embodiments, the chip 40 is exposed to the suction holes 210 having a greater size at the edge portion and having a smaller size at the center portion of the convex surface 201 to deform the chip 40 prior to bonding the chip 40 to a package substrate.

Figure 4D:
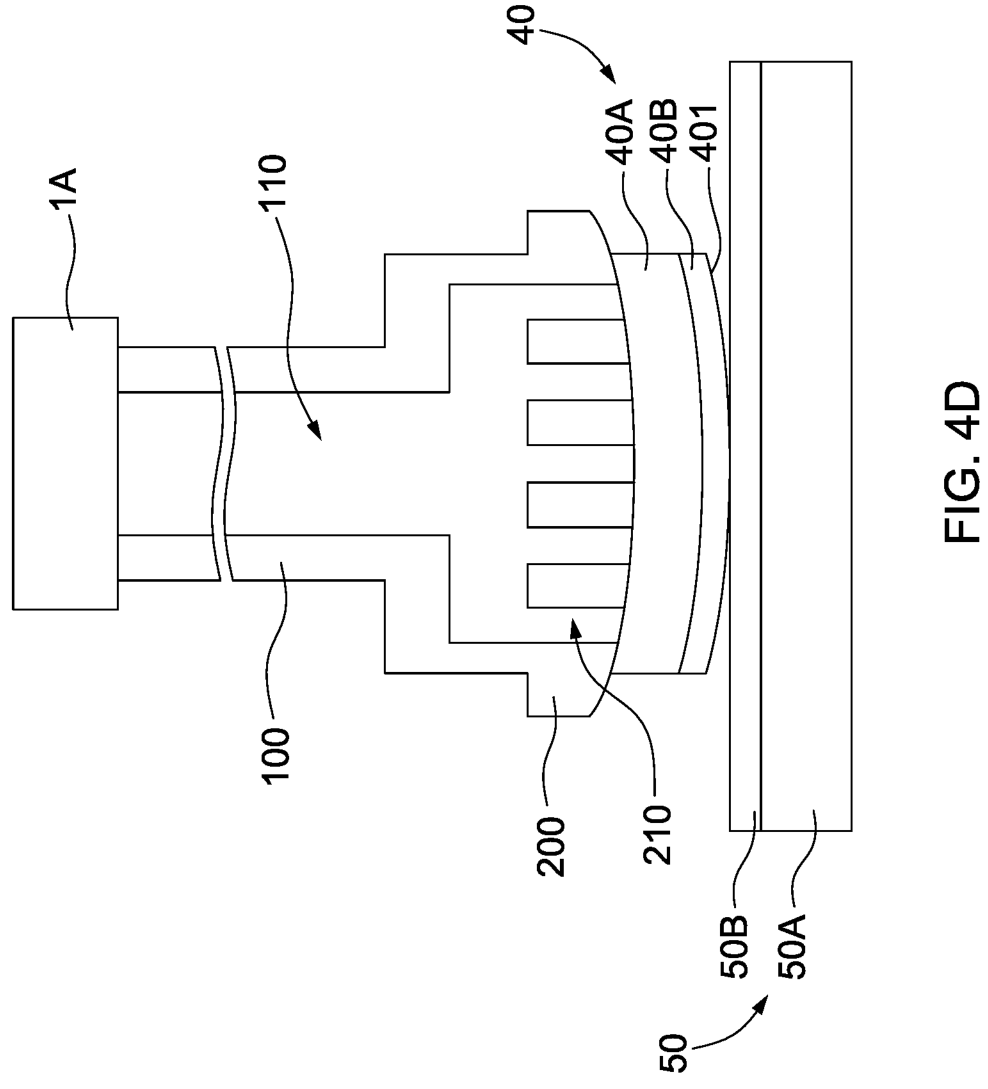

Referring to FIG. 4D, the chip 40 is bonded to a package substrate 50 by the pick-and-place tool 10. The package substrate 50 may include a package substrate strip including one or more devices in one or more device packages. In some embodiments, the package substrate 50 includes a semiconductor substrate 50A and a bonding layer 50B. The bonding layer 50B may be configured to be hybrid-bonded or fusion-bonded to another bonding layer. In some embodiments, the bonding layer 50B includes a dielectric layer. The dielectric layer may be or include silicon oxide, silicon oxynitride, or the like.

In some embodiments, a center portion of the chip 40 is brought in contact with the package substrate 50 prior to bringing an edge portion of the chip 40 in contact with the package substrate 50. In some embodiments, a center portion of the bonding layer 40B of the chip 40 is brought in contact with the bonding layer 50B of the package substrate 50 prior to bringing an edge portion of the bonding layer 40B of the chip 40 in contact with the bonding layer 50B of the package substrate 50.

Figure 4E:
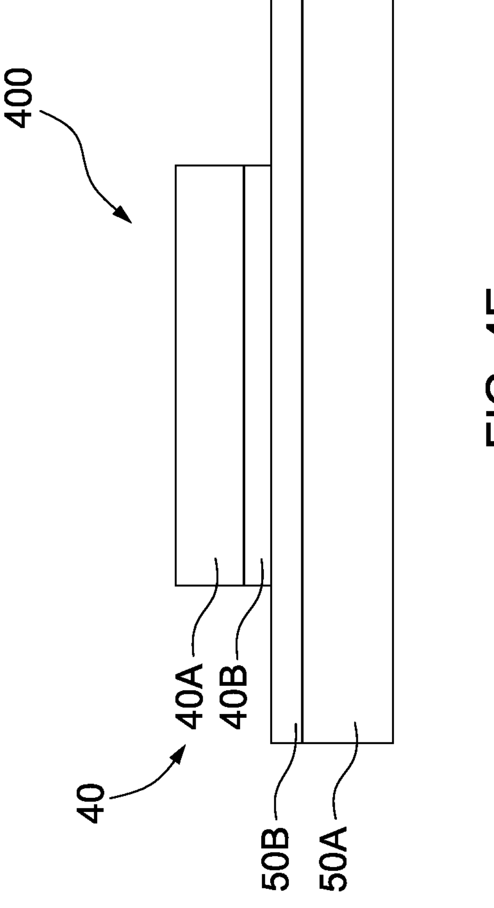

Referring to FIG. 4E, the edge portion of the chip 40 may be further brought in contact with the package substrate 50 to entirely bond the chip 40 to the package substrate 50 so as to form a semiconductor structure 400. In some embodiments, the chip 40 is fusion-bonded to the package substrate 50 to form the semiconductor structure 400.

Figure 5A:
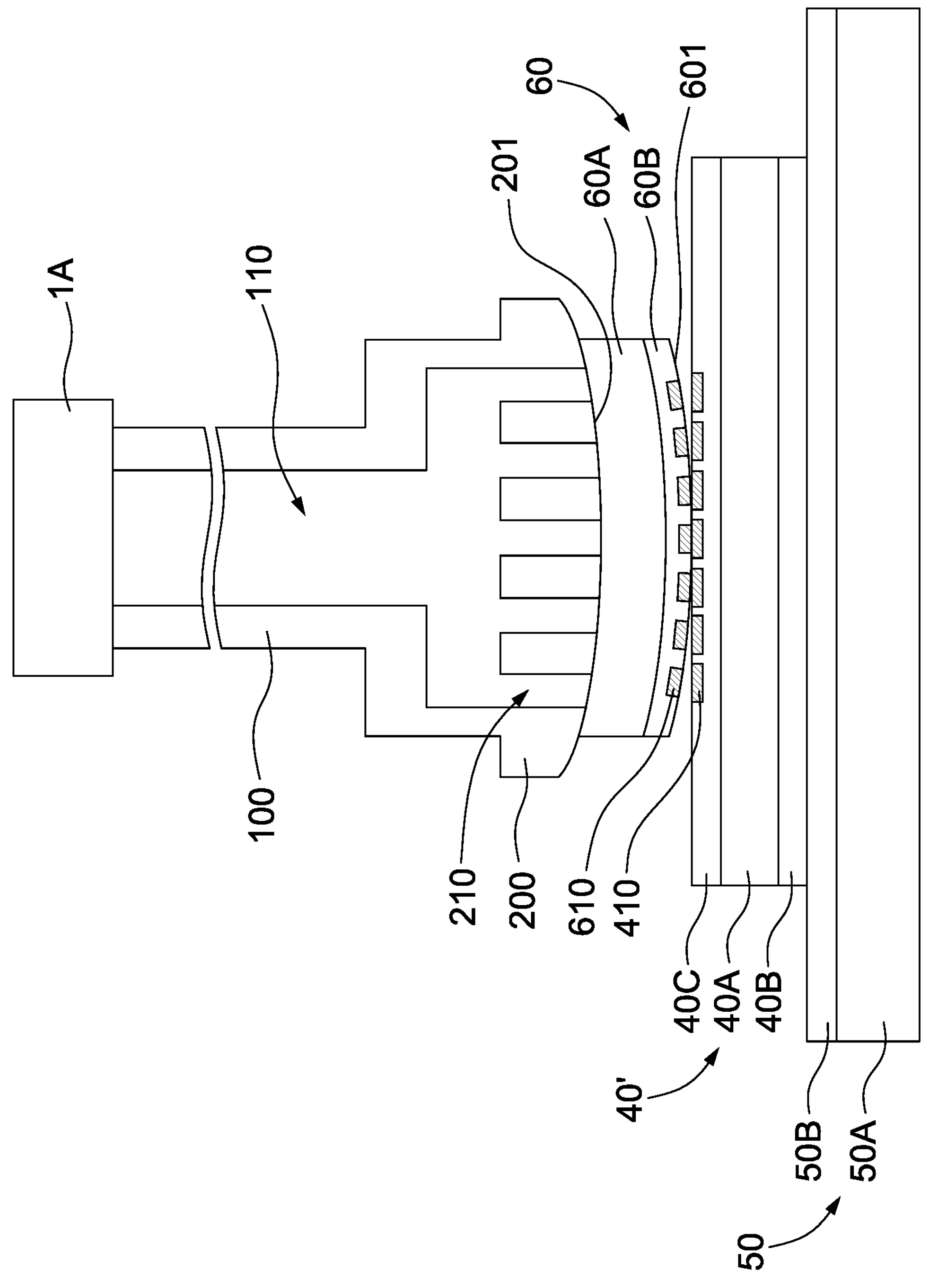
FIGS. 5A to 5B are schematic views of intermediate stages of a method of manufacturing a semiconductor structure in accordance with some embodiments of the present disclosure.
Figure 5B:
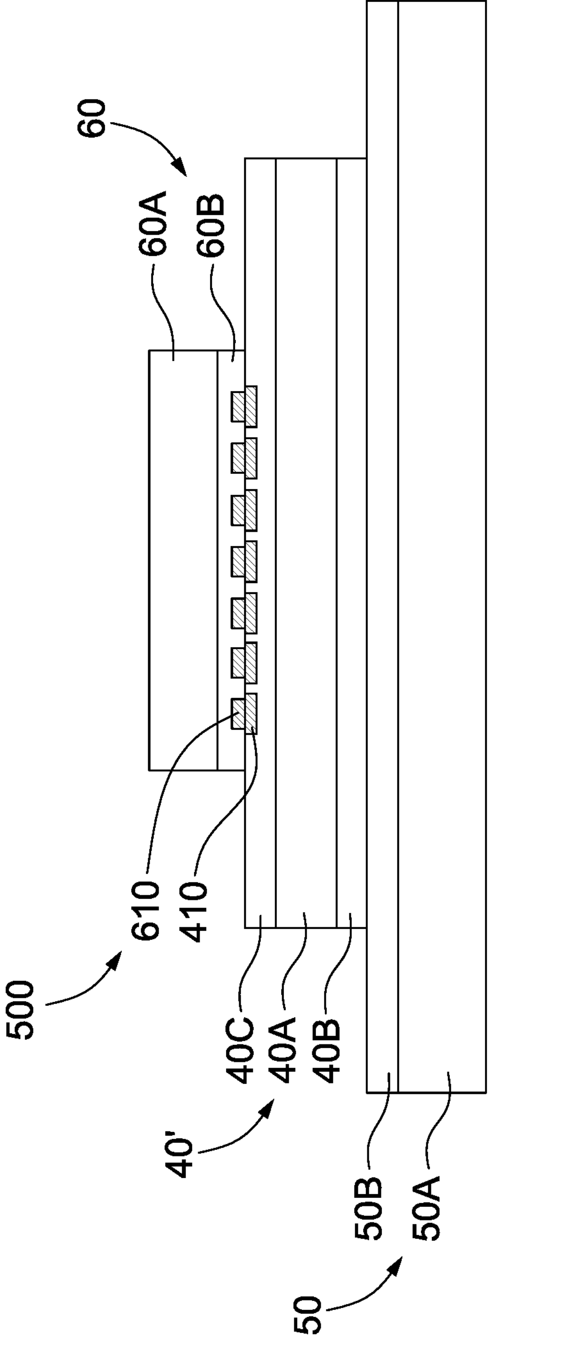

FIGS. 5A to 5B are schematic views of intermediate stages of a method of manufacturing a semiconductor structure 500 in accordance with some embodiments of the present disclosure.

Referring to FIG. 5A, operation similar to those illustrated in FIGS. 4A-4E may be performed to bond a chip 40' to a package substrate 50. The chip 40' may include a semiconductor substrate 40A and bonding layers 40B and 40C. The bonding layer 40C may include a dielectric layer and bonding pads (also referred to as "hybrid bond pads") 410 in the dielectric layer.

Still referring to FIG. 5A, a chip 60 including a semiconductor substrate 60A and a bonding layer 60B may be provided. The bonding layer 60B may be configured to be hybrid-bonded to another bonding layer. In some embodiments, the bonding layer 60B includes a dielectric layer and bonding pads (also referred to as "hybrid bond pads") 610 in the dielectric layer. The dielectric layer may be or include silicon oxide, silicon oxynitride, or the like. In some embodiments, the convex surface 201 of the attaching head 200 is brought towards the chip 60, and the convex surface 201 of the attaching head 200 is brought towards the chip 60 to attract the chip 60 by a suction force. In some embodiments, the chip 60 deforms to conform to the convex surface 201 of the attaching head 200 and form a convex surface 601 toward the bonding layer 40C of the chip 40'.

Still referring to FIG. 5A, in some embodiments, the chip 60 is bonded to chip 40' by the pick-and-place tool 10. In some embodiments, a center portion of the chip 60 is brought in contact with the chip 40' prior to bringing an edge portion of the chip 60 in contact with the chip 40'. In some embodiments, a center portion of the bonding layer 60B of the chip 60 is brought in contact with the bonding layer 40C of the chip 40' prior to bringing an edge portion of the bonding layer 60B of the chip 60 in contact with the bonding layer 40C of the chip 40'.

Referring to FIG. 5B, the edge portion of the chip 60 may be further brought in contact with the chip 40' to entirely bond the chip 60 to the chip 40' so as to form a semiconductor structure 500. In some embodiments, the chip 60 is hybrid-bonded to the chip 40' to form the semiconductor structure 500.

Figures 6A, 6B:
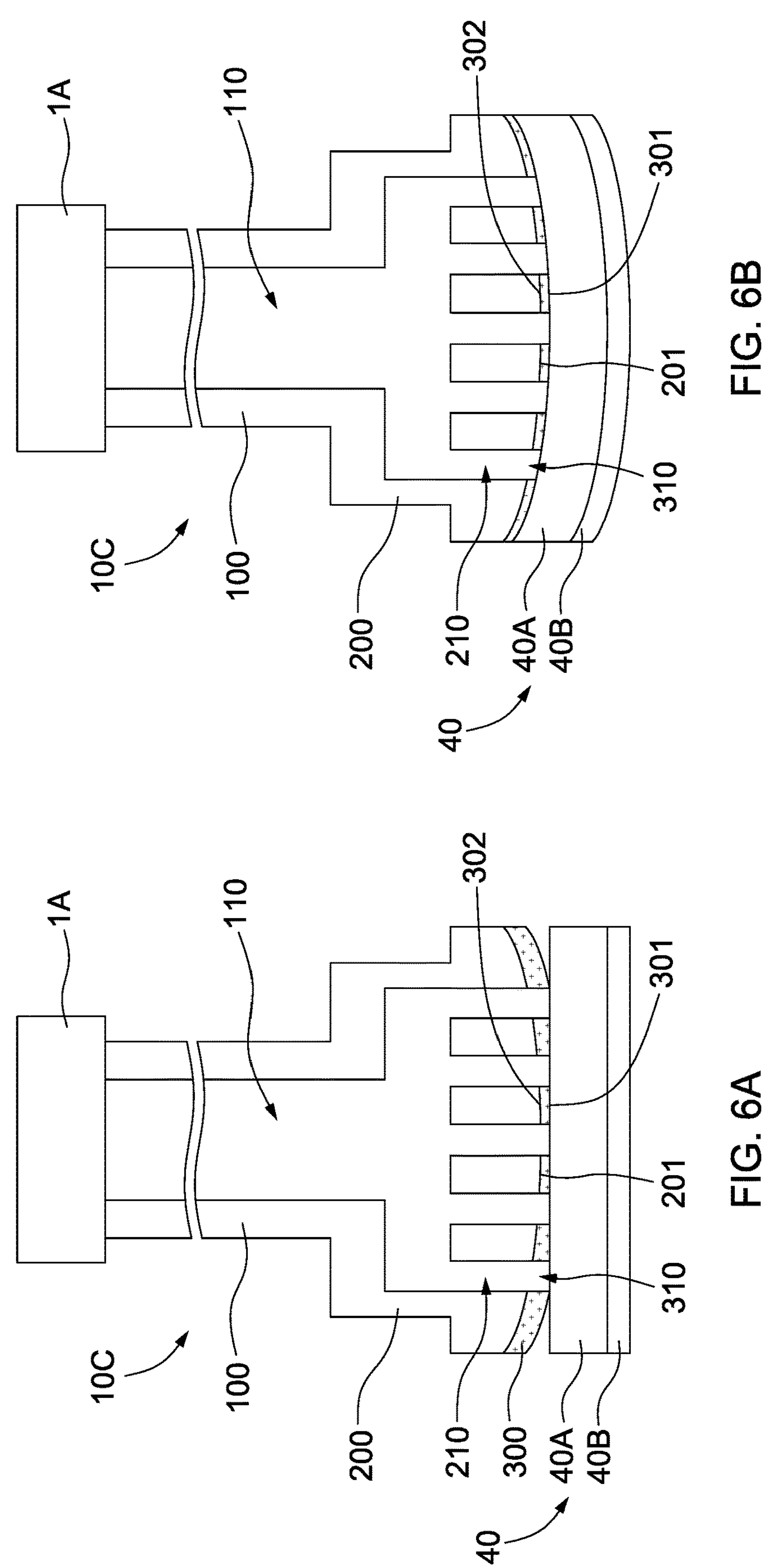
FIGS. 6A to 6B are schematic views of intermediate stages of a method of manufacturing a semiconductor structure in accordance with some embodiments of the present disclosure.

FIGS. 6A to 6B are schematic views of intermediate stages of a method of manufacturing a semiconductor structure in accordance with some embodiments of the present disclosure.

Referring to FIG. 6A, the pick-and-place tool 10C may further include a buffer element 300 mounted on the convex surface 201 of the attaching head 200. In some embodiments, the buffer element 300 of the pick-and-place tool 10C is brought towards the chip 40. In some embodiments, when a center portion of the buffer element 300 contacts the chip 40, the buffer element 300 is flexible and deforms to contact the chip 40, and the chip 40 is not deformed at this stage.

Referring to FIG. 6B, the buffer element 300 may be further brought towards the chip 40 to attract the chip 40 by the suction force. In some embodiments, the buffer element 300 deforms when the chip 40 is attached onto the buffer element 300 by the suction force. In some embodiments, when the chip 40 is entirely attached onto the buffer element 300, the chip 40 deforms to conform to the convex surface of the buffer element 300.

Next, operation similar to those illustrated in FIGS. 4D-4E or FIGS. 5A-5B may be further performed to bond the chip 40 to a package substrate or another chip to form a semiconductor structure.

Figures 7A, 7B:
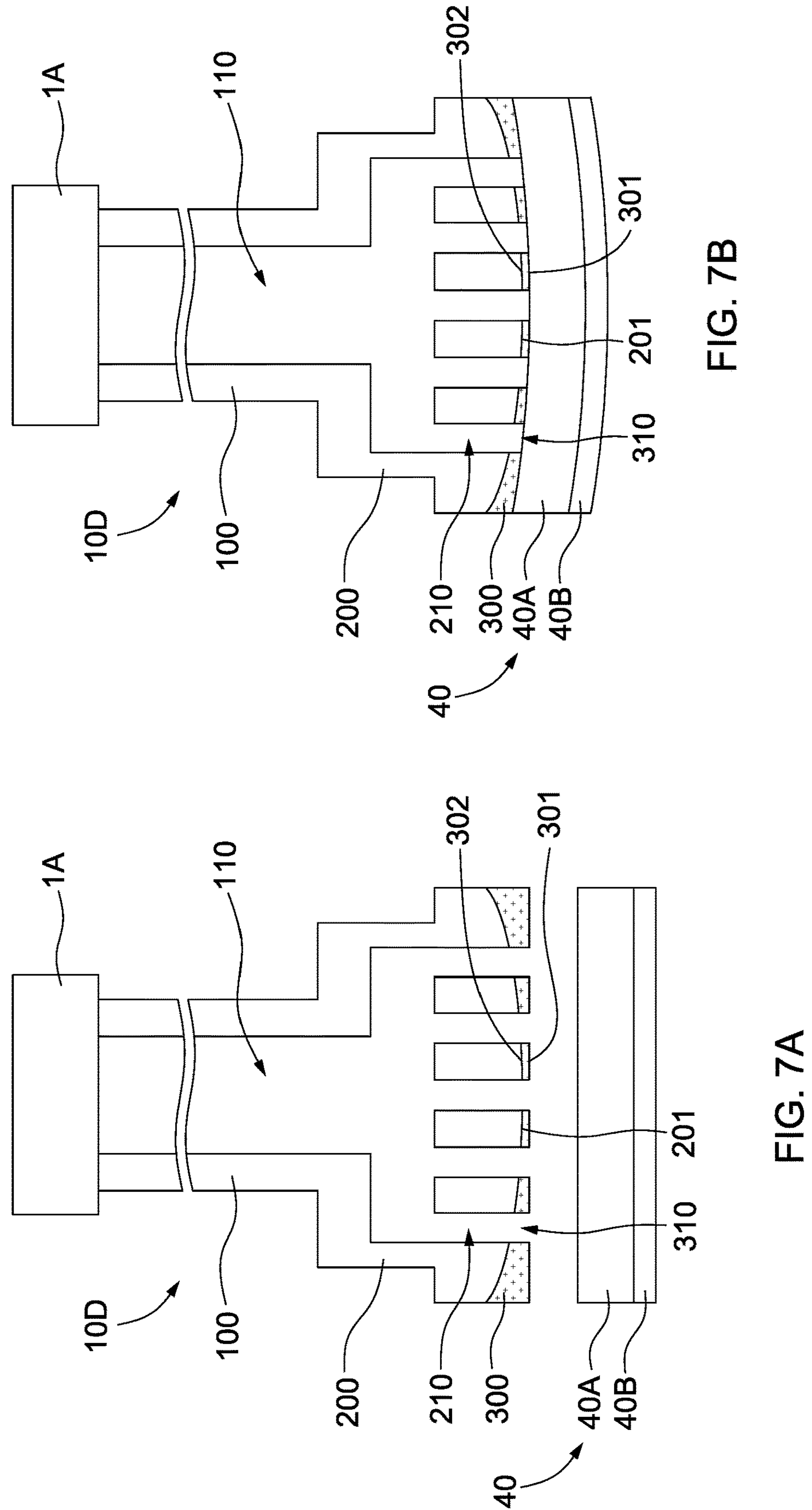
FIGS. 7A to 7B are schematic views of intermediate stages of a method of manufacturing a semiconductor structure in accordance with some embodiments of the present disclosure.

FIGS. 7A to 7B are schematic views of intermediate stages of a method of manufacturing a semiconductor structure in accordance with some embodiments of the present disclosure.

Referring to FIGS. 7A-7B, operations similar to those illustrated in FIGS. 6A-6B may be performed. In some embodiments, while the chip 40 is less flexible to deform to a certain curvature that fits the curved shape of the convex surface 201 of the attaching head 200, the design of the buffer member 300 provides a buffering support at the edge portion of the chip 40. Therefore, the warpage of the chip 40 can be reduced while the suction between the pick-and-place tool 10D and the chip 40 can remain satisfactory for the following bonding process.

Figure 8B:
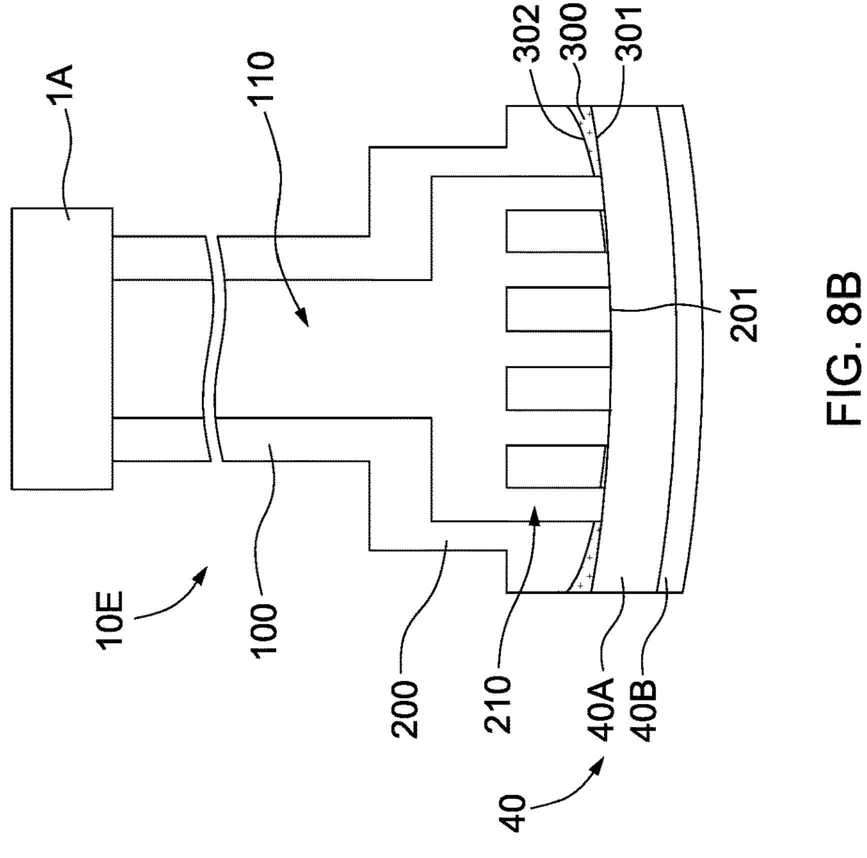
FIGS. 8A to 8B are schematic views of intermediate stages of a method of manufacturing a semiconductor structure in accordance with some embodiments of the present disclosure.
Figure 8A:
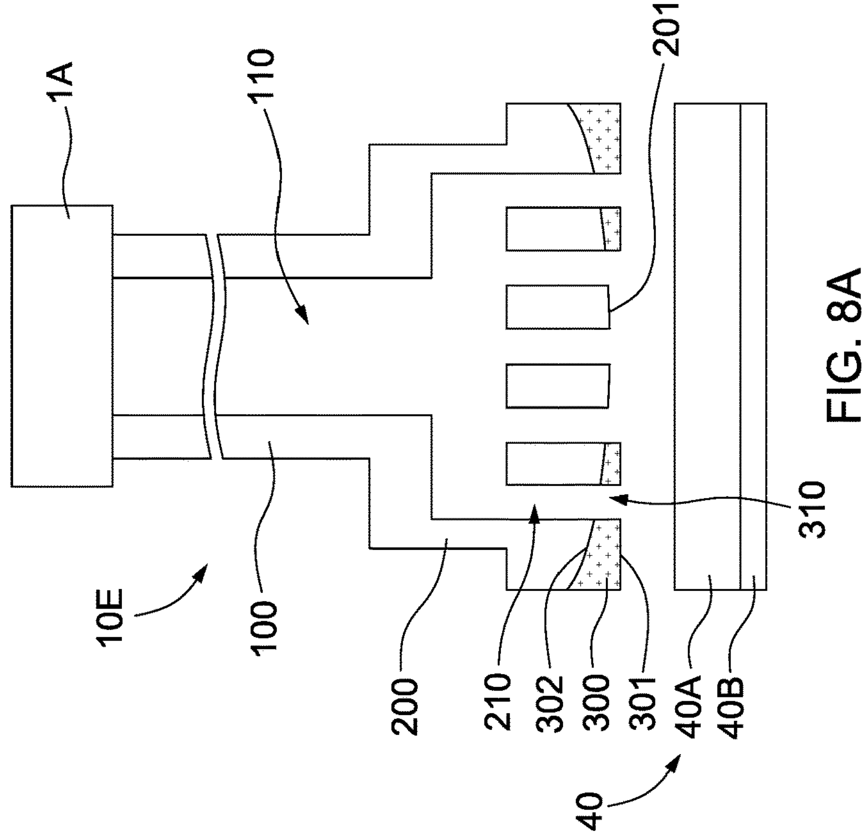

FIGS. 8A to 8B are schematic views of intermediate stages of a method of manufacturing a semiconductor structure in accordance with some embodiments of the present disclosure.

Referring to FIGS. 8A-8B, operations similar to those illustrated in FIGS. 6A-6B may be performed. In some embodiments, while the chip 40 is less flexible to deform to a certain curvature that fits the curved shape of the convex surface 201 of the attaching head 200, the design of the buffer member 300 provides a buffering support at the edge portion of the chip 40. Therefore, the warpage of the chip 40 can be reduced while the suction between the pick-and-place tool 10E and the chip 40 can remain satisfactory for the following bonding process.

Figures 9A, 9B:
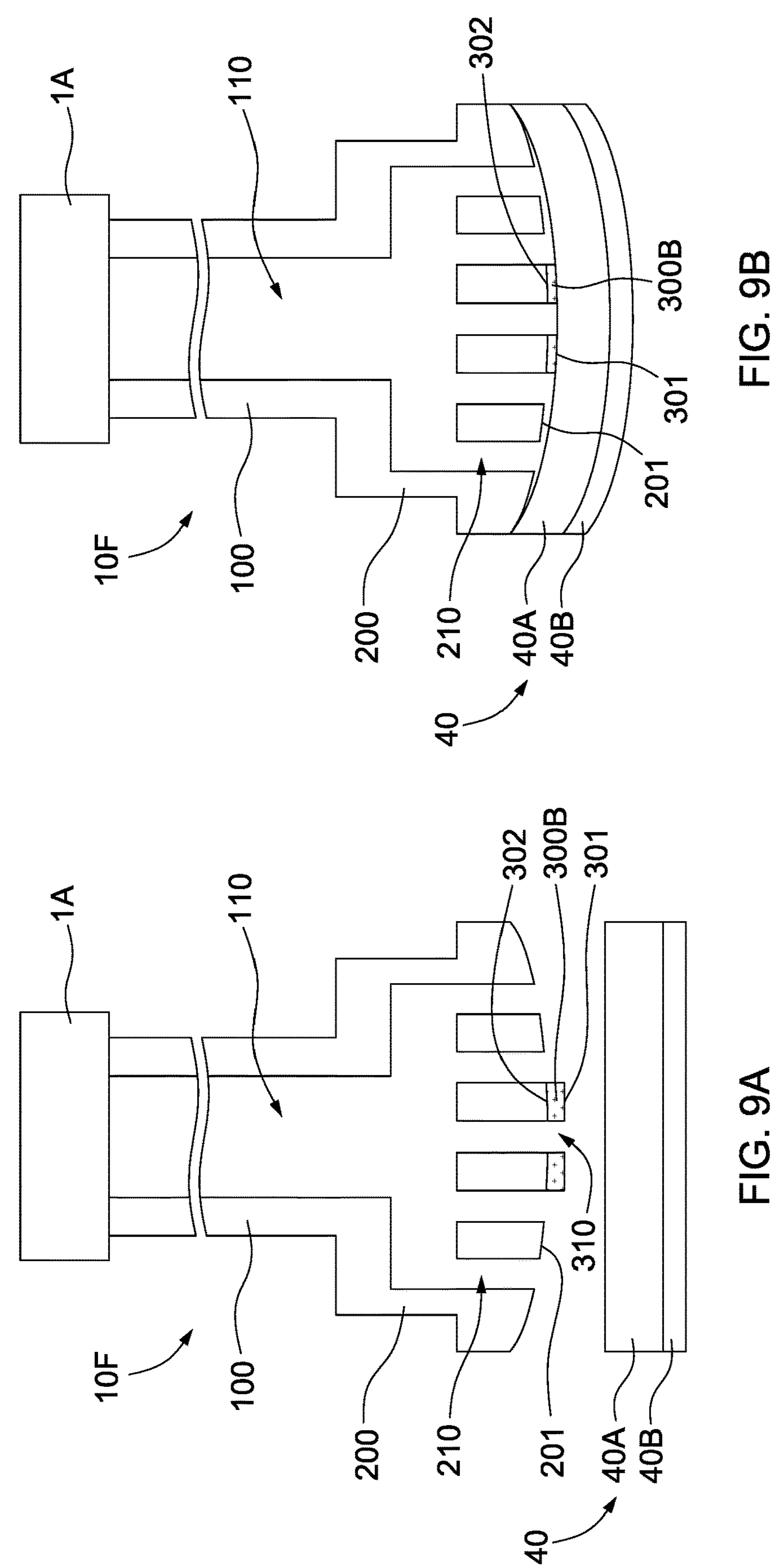
FIGS. 9A to 9B are schematic views of intermediate stages of a method of manufacturing a semiconductor structure in accordance with some embodiments of the present disclosure.

FIGS. 9A to 9B are schematic views of intermediate stages of a method of manufacturing a semiconductor structure in accordance with some embodiments of the present disclosure.

Referring to FIGS. 9A-9B, operations similar to those illustrated in FIGS. 6A-6B may be performed. In some embodiments, while the chip 40 is formed of a flexible material that can sustain a relatively high deformation level and may deform to a certain curvature that exceeds the curved shape of the convex surface 201 of the attaching head 200, the design of the buffer member 300 provides a buffering support at the center portion of the chip 40. Therefore, the warpage of the chip 40 can be further increased while the suction between the pick-and-place tool 10F and the chip 40 can remain satisfactory, and the center portion of the bonding layer 40B of the chip 40 is further protruded which is advantageous to the following bonding process.

Some embodiments of the present disclosure provide a pick-and-place tool. The pick-and-place tool includes a bond base and an attaching head. The attaching head is connected to the bond base and configured to attract a chip by a suction force. The attaching head has an attaching surface that is convex toward the chip, the attaching head has a plurality of suction holes penetrating the attaching surface, and the attaching head attracts the chip using the suction force via the suction holes.

Some embodiments of the present disclosure provide a pick-and-place tool. The pick-and-place tool includes a bond base, an attaching head, and a buffer element. The attaching head is connected to the bond base and having a convex surface. The buffer element is mounted on the convex surface of the attaching head and configured to attract a chip by a suction force, wherein a hardness of the buffer element is less than a hardness of the attaching head.

Some embodiments of the present disclosure provide a method of manufacturing a semiconductor structure. The method includes following operations: providing a pick-and-place tool comprising an attaching head having a convex surface; bringing the convex surface of the attaching head towards a chip to attract the chip by a suction force, wherein the chip deforms according to the convex surface of the attaching head when being attracted by the attaching head; and bonding the chip to a package substrate by the pick-and-place tool.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pick-and-place tool, comprising:

a bond base; and an attaching head connected to the bond base and configured to attract a chip by a suction force, wherein the attaching head has an attaching surface that is convex toward the chip, the attaching head has a plurality of suction holes penetrating the attaching surface, and the attaching head attracts the chip using the suction force via the suction holes, and wherein a size of the suction holes located at an edge portion of the attaching surface is greater than a size of the suction holes located at a center portion of the attaching surface.

2. The pick-and-place tool of claim 1, wherein the bond base comprises a plurality of channels each connecting one of the suctions holes to a respective pressure source.

3. The pick-and-place tool of claim 2, wherein a suction force supplied through the channels connected to the suction holes located at an edge portion of the attaching surface is greater than a suction force supplied through the channels connected to the suction holes located at a center portion of the attaching surface.

4. The pick-and-place tool of claim 1, further comprising a flexible element mounted on the attaching surface of the attaching head, wherein the flexible element comprises a plurality of through holes each connecting to one of the suction holes of the attaching head.

5. The pick-and-place tool of claim 4, wherein the flexible element is detachably mounted on the attaching surface of the attaching head.

6. The pick-and-place tool of claim 1, wherein the attaching head comprises a flexible material and is detachably mounted on the bond base.

7. The pick-and-place tool of claim 1, wherein the suction holes are located at a peripheral portion of the attaching surface surrounding a center portion of the attaching surface.

8. A pick-and-place tool, comprising:

a bond base; and an attaching head connected to the bond base and having a convex surface; and a buffer element mounted on the convex surface of the attaching head and configured to attract a chip by a suction force, wherein a hardness of the buffer element is less than a hardness of the attaching head, wherein the attaching head has a plurality of suction holes penetrating the convex surface, the buffer element comprises a plurality of through holes each connecting to one of the suction holes of the attaching head, and the buffer element attracts the chip using the suction force via the suction holes and the through holes.

9. The pick-and-place tool of claim 8, wherein the buffer element deforms when the chip is attached onto the buffer element by the suction force.

10. The pick-and-place tool of claim 8, wherein the buffer element comprises a flexible material and conforms to the convex surface of the attaching head.

11. The pick-and-place tool of claim 8, wherein the bond base comprises a plurality of channels each connecting one of the through holes to a respective pressure source.

12. The pick-and-place tool of claim 8, wherein a portion of the convex surface of the attaching head is exposed by the buffer element.

13. The pick-and-place tool of claim 8, wherein the buffer element is detachably mounted on the convex surface of the attaching head.

14. A method of manufacturing a semiconductor structure, comprising:

providing a pick-and-place tool comprising an attaching head having a convex surface;

bringing the convex surface of the attaching head towards a chip to attract the chip by a suction force, wherein the chip deforms according to the convex surface of the attaching head when being attracted by the attaching head; and bonding the chip to a package substrate by the pick-and-place tool, wherein the attaching head is made of metal, and the chip deforms to conform to the convex surface of the attaching head and form a convex surface toward the package substrate prior to bonding to the package substrate.

15. The method of claim 14, further comprising applying a first suction force on an edge portion of the chip and applying a second suction force, which is smaller than the first suction force, on a center portion of the chip to deform the chip prior to bonding the chip to the package substrate.

16. The method of claim 14, wherein the attaching head comprises a plurality of suction holes penetrating the convex surface, a size of the suction holes located at an edge portion of the convex surface is greater than a size of the suction holes located at a center portion of the convex surface, and the method further comprises exposing the chip to the suction holes at the edge portion and the center portion of the convex surface to deform the chip prior to bonding the chip to the package substrate.

17. The method of claim 14, wherein the pick-and-place tool further comprises a flexible element mounted on the convex surface of the attaching head, and the method further comprises bringing the flexible element towards the chip to attract the chip by the suction force.

18. The method of claim 17, wherein the flexible element deforms when the chip is attached onto the flexible element by the suction force.

19. The method of claim 14, wherein bonding the chip to the package substrate comprises bringing a center portion of the chip in contact with the package substrate prior to bringing an edge portion of the chip in contact with the package substrate.

20. The method of claim 14, wherein the chip is bonded to a second chip.

* * * * *